(12) United States Patent
Kim et al.

(10) Patent No.: US 12,255,414 B2
(45) Date of Patent: Mar. 18, 2025

(54) PACKAGE BOARD, ANTENNA PACKAGE INCLUDING THE SAME AND IMAGE DISPLAY DEVICE INCLUDING THE SAME

(71) Applicant: DONGWOO FINE-CHEM CO., LTD., Jeollabuk-do (KR)

(72) Inventors: Na Yeon Kim, Seoul (KR); Young Ju Kim, Gyeonggi-do (KR); Hee Jun Park, Gyeonggi-do (KR); Won Hee Lee, Gyeonggi-do (KR)

(73) Assignee: DONGWOO FINE-CHEM CO., LTD., Jeollabuk-Do (KR)

(*) Notice: Subject to any disclaimer, the term of this patent is extended or adjusted under 35 U.S.C. 154(b) by 219 days.

(21) Appl. No.: 17/862,868

(22) Filed: Jul. 12, 2022

(65) Prior Publication Data

US 2023/0019483 A1    Jan. 19, 2023

(30) Foreign Application Priority Data

Jul. 13, 2021 (KR) .......... 10-2021-0091502

(51) Int. Cl.
| | |
|---|---|
| *H01R 12/59* | (2011.01) |
| *H01Q 1/24* | (2006.01) |
| *H01Q 9/04* | (2006.01) |
| *H01Q 21/08* | (2006.01) |
| *H01R 12/77* | (2011.01) |
| *H01R 13/646* | (2011.01) |
| *H05K 1/02* | (2006.01) |
| *H01R 12/79* | (2011.01) |

(52) U.S. Cl.
CPC .......... *H01R 12/592* (2013.01); *H01Q 1/243* (2013.01); *H01Q 9/0407* (2013.01); *H01Q 21/08* (2013.01); *H01R 12/77* (2013.01); *H01R 13/646* (2013.01); *H05K 1/0237* (2013.01); *H01R 12/79* (2013.01); *H05K 2201/09263* (2013.01); *H05K 2201/10189* (2013.01)

(58) Field of Classification Search
CPC .................................................. H01R 2201/02
See application file for complete search history.

(56) References Cited

U.S. PATENT DOCUMENTS

| | | | | |
|---|---|---|---|---|
| 8,998,624 | B2 * | 4/2015 | Ida .................. | H01R 13/20 |
| | | | | 439/74 |
| 2021/0320444 | A1 * | 10/2021 | Lee ..................... | H04M 1/0274 |
| 2021/0328385 | A1 * | 10/2021 | Maeda .................. | H01R 12/73 |
| 2022/0123048 | A1 * | 4/2022 | Swenson .............. | H10N 60/12 |
| 2022/0200134 | A1 * | 6/2022 | Yoon ................. | H01Q 21/205 |
| 2022/0312594 | A1 * | 9/2022 | Park ..................... | G06F 30/394 |
| 2023/0019483 | A1 * | 1/2023 | Kim ...................... | H01Q 1/243 |

FOREIGN PATENT DOCUMENTS

| | | | |
|---|---|---|---|
| CN | 217848324 U | * 11/2022 | .......... H01Q 1/2283 |
| KR | 10-2013-0095451 A | 8/2013 | |
| KR | 10-2019-0094597 A | 8/2019 | |

* cited by examiner

*Primary Examiner* — James Harvey

(74) *Attorney, Agent, or Firm* — The PL Law Group, PLLC

(57) ABSTRACT

A package board according to an embodiment of the present disclosure includes a first core layer, a feeding wiring disposed on the first core layer, and a first connector mounted on the first core layer and electrically connected to the feeding wiring through a row directional side thereof. The feeding wiring includes a first portion extending in a column direction of the first core layer and a second portion bent from the first portion to extend in a row direction of the first core layer.

14 Claims, 5 Drawing Sheets

PACKAGE BOARD, ANTENNA PACKAGE INCLUDING THE SAME AND IMAGE DISPLAY DEVICE INCLUDING THE SAME

CROSS-REFERENCE TO RELATED APPLICATION AND CLAIM OF PRIORITY

This application claims the benefit under 35 USC § 119 of Korean Patent Application No. 10-2021-0091502 filed on Jul. 13, 2021 in the Korean Intellectual Property Office (KIPO), the entire disclosures of which is incorporated herein by reference for all purposes.

BACKGROUND

1. Field

The present invention relates to a package board, an antenna package including the same and an image display device including the same. More particularly, the present invention relates to a package board including a feeding wiring and a connector, an antenna package including the same and an image display device including the same.

2. Description of the Related Art

As information technologies have been developed, a wireless communication technology such as Wi-Fi, Bluetooth, etc., is combined with an image display device in, e.g., a smartphone form. In this case, an antenna may be combined with the image display device to provide a communication function.

According to developments of a mobile communication technology, an antenna capable of implementing, e.g., high frequency or ultra-high frequency band communication is needed in the display device.

However, as a driving frequency of the antenna increases, a signal loss may be increased. As a length of a transmission path increases, the signal loss may be further increased.

To connect the antenna to, e.g., a main board of an image display device, a package board including a flexible printed circuit board and a connection intermediate structure such as a connector may be used. In this case, a signal loss and a phase difference between circuits may be further increased by the connection intermediate structure.

Accordingly, construction of a circuit connection structure for achieving reliability of an electrical connectivity while maintaining or improving radiation properties of the antenna is needed.

SUMMARY

According to an aspect of the present invention, there is provided a package board having improved electrical reliability.

According to an aspect of the present invention, there is provided an antenna package including a package board having improved electrical reliability.

According to an aspect of the present invention, there is provided an image display device including a package board having improved electrical reliability.

(1) A package board, including: a first core layer; a feeding wiring disposed on the first core layer, wherein the feeding wiring includes: a first portion extending in a column direction of the first core layer; and a second portion bent from the first portion to extend in a row direction of the first core layer; and a first connector mounted on the first core layer and electrically connected to the feeding wiring through a row directional side thereof.

(2) The package board of the above (1), wherein the first connector includes a first terminal disposed at the row directional side and electrically connected to an end portion of the feeding wiring, and a plurality of the first terminals are arranged to form first terminal columns, and the first terminal columns are arranged in the row direction to form a double-column structure.

(3) The package board of the above (2), wherein two first terminals of the plurality of the first terminals which are included in different first terminal columns are staggered in the row direction.

(4) The package board of the above (2), wherein the feeding wiring includes a plurality of feeding wirings each of which is electrically connected to each of the first terminals of the first connector through the row directional side of the first connector, and at least one of the plurality of feeding wirings includes a winding portion.

(5) The package board of the above (4), wherein at least two feeding wirings of the plurality of feeding wirings each includes the winding portion, and an extension length of each winding portion included in different feeding wirings decreases as a distance from the first connector increases in the row direction.

(6) The package board of the above (4), wherein lengths of the plurality of feeding wirings are the same.

(7) The package board of the above (4), wherein the plurality of feeding wirings are asymmetrically arranged with respect to a central line extending in the column direction on the first connector in a plan view.

(8) The package board of the above (1), wherein a length of the first connector in the column direction is greater than a length of the first connector in the row direction.

(9) The package board of the above (1), wherein the first connector has an upper side, a lower side and both lateral sides in a plan view, and the feeding wiring is connected only through at least one of the both lateral sides of the first connector.

(10) An antenna package, including: an antenna device including an antenna unit; and the package board according to embodiments as described above electrically connected to the antenna unit through the feeding wiring.

(11) The antenna package of the above (10), wherein the antenna unit includes a radiator, a transmission line connected to the radiator and a signal pad connected to an end portion of the transmission line, and the signal pad is electrically connected to the feeding wiring.

(12) The antenna package of the above (10), further including: a circuit board including a second core layer and a connection wiring; a second connector mounted on the second core layer and coupled to the first connector including a first terminal, the second connector including a second terminal electrically connected to the first terminal; and an antenna driving integrated circuit chip mounted on the second core layer and electrically connected to the second connector through the connection wiring.

(13) The antenna package of the above (12), wherein the second terminal includes a plurality of second terminals forming second terminal columns of a double-column structure arranged in the row direction.

(14) An image display device, including: a display panel; and the antenna package according to embodiments as described above disposed on the display panel.

According to exemplary embodiments of the present invention, a feeding wiring and a first connector may be electrically connected to each other through a row directional side of the first connector of a package board. Thus, the feeding wiring may be connected to the first connector without a bypass along the first connector, so that a spatial efficiency may be improved.

Further, at least some of a plurality of the feeding wirings may include a winding portion. In this case, a length of a relatively short feeding wiring may be compensated by the winding portion, and lengths of the plurality of the feed wirings may be substantially the same. Accordingly, a phase difference and a signal loss of antenna units that may be connected to each feeding wiring may be reduced.

In exemplary embodiments, the package board bonded to an antenna device and a circuit board on which an antenna driving integrated circuit chip is mounted may be electrically connected to each other through a connector structure. Accordingly, a bonding process or an attachment process for connecting the package board and the circuit board may be omitted, and a stable circuit board connection may be easily implemented.

DETAILED DESCRIPTION OF THE EMBODIMENTS

According to exemplary embodiments of the present invention, there is provided a package board including a feeding wiring and a connector. According to exemplary embodiments of the present invention, there is also provided an antenna package and an image display device including the package board.

Hereinafter, the present invention will be described in detail with reference to the accompanying drawings. However, those skilled in the art will appreciate that such embodiments described with reference to the accompanying drawings are provided to further understand the spirit of the present invention and do not limit subject matters to be protected as disclosed in the detailed description and appended claims.

Figure 1:
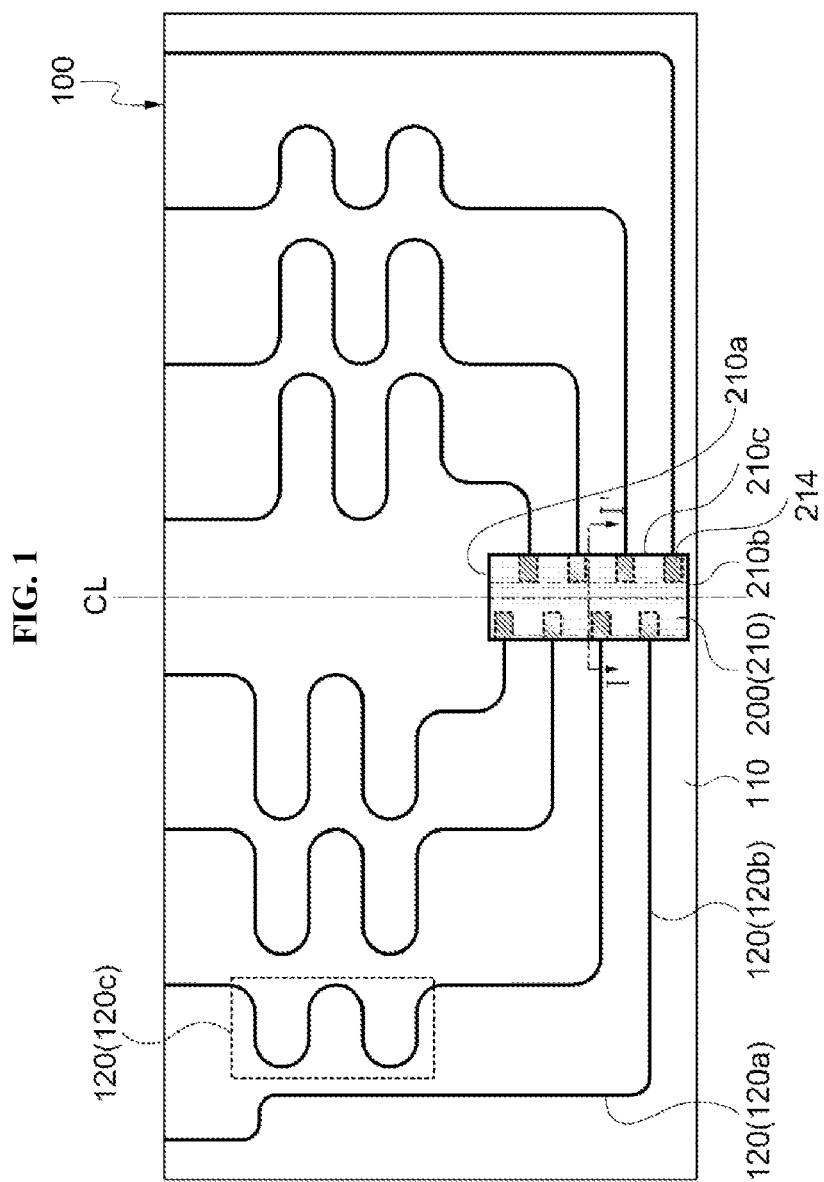
FIG. 1 is a schematic top plan view illustrating a package board in accordance with exemplary embodiments.

FIG. 1 is a schematic top plan view illustrating a package board in accordance with exemplary embodiments.

Referring to FIG. 1, a package board 100 may include a first core layer 110, a feeding wiring 120 and a first connector 210.

In exemplary embodiments, the feeding wiring 120 may be disposed on the first core layer 110, and may include a first portion 120a extending in a column direction of the first core layer 110, and a second portion 120b bent from the first portion 120a to extend in a row direction of the first core layer 110.

The terms "column direction" and "row direction" used in the present application may refer to a length direction and a width direction of the package board 100 or the first core layer 110, respectively. The column direction and row direction do not indicate absolute directions, and may be used to relatively define a direction of each element. For example, the column direction and the row direction may be perpendicular to each other on the package board 100 or the first core layer 110.

In an embodiment, the feeding wiring 120 may serve as a feeding wiring of an antenna unit to be described later. In this case, a terminal end of the first portion 120a may be electrically connected to the antenna unit, and a terminal end of the second portion 120b may be electrically connected to the first connector 210 through a row directional side of the first connector 210.

For example, the first connector 210 may be electrically connected to the feeding wiring 120 through the row directional side. In this case, a terminal end of the feeding wiring 120 may be electrically connected to the first connector 210 without a bypass of the first connector 210. Accordingly, an extension distance of the feeding wiring 120 may be reduced, so that a spatial efficiency of the package board 100 may be improved.

In some embodiments, the first connector 210 may include an upper side 210a, a lower side 210b and both row directional sides 210c in a plan view, and the feeding wiring 120 may be connected to the first connector only through at least one of the both row directional sides 210c.

Thus, a circuit bypass along the upper side 210a and the lower side 210b of the first connector 210 may be prevented when connecting the feeding wiring 120. Accordingly, the spatial efficiency of the package board 100 may be improved, and lengths of the feeding wirings 120 may be adjusted to be substantially the same as will be described later.

For example, the first core layer 110 may serve as a core layer of a flexible printed circuit board (FPCB).

The first core layer 110 may include, e.g., a flexible resin such as a polyimide resin, modified polyimide (MPI), an epoxy resin, polyester, a cycloolefin polymer (COP), a liquid crystal polymer (LCP), or the like. The first core layer 110 may include an internal insulating layer included in the package board 100.

For example, the feeding wiring 120 may serve as a feeding line of the antenna unit to be described later.

In some embodiments, a plurality of the feeding wirings 120 may be electrically connected to the first connector 210 through the row directional side of the first connector 210.

For example, as illustrated in FIG. 1, some of the plurality of the feeding wirings 120 may be electrically connected to the first connector 210 through one of the row directional sides, and remaining feeding wires 120 may be electrically connected to the first connector 210 through the other row directional side.

In this case, the feeding wirings 120 may be connected to the first connector 210 without the bypass of the first connector 210. Accordingly, the feeding wirings 120 may be efficiently disposed on the first core layer 110, and a length adjustment of the feeding wirings 120 by a winding portion 120c, which will be described later, may be easily implemented.

In some embodiments, at least a portion of the feeding wirings 120 may include the winding portion 120c that is bent. In this case, a length of the relatively short feeding wiring 120 may be compensated by the winding portion 120c. Accordingly, a phase difference and a signal loss of the antenna unit may be reduced.

For example, the row direction may include a left direction and a right direction. In this case, the term "winding portion" used herein refers to at least one portion in which the feeding wiring 120 extends in the left direction and is bent by 180° or more to extend in the right direction, and/or extends in the right direction and is bent 180° or more to extend in the left direction.

In some embodiments, the lengths of the feeding wires 120 may become substantially the same due to the above-described winding portion 120c. Accordingly, when the feeding wirings 120 are provided as the feeding lines of the antenna unit, the phase difference and the signal loss of the antenna unit may be reduced. Thus, an antenna package having improved antenna gain and improved signal efficiency may be implemented.

The term "substantially the same length" refers to mathematically the same length, and similar lengths that may be regarded as substantially the same.

In some embodiments, extension lengths of the winding portions 120c included in different feeding wirings 120 may become smaller, as a distance from the first connector 210 in the row direction increases.

In this case, a length of the feeding wiring 120 having a relatively short linear distance in the column direction and a length of the other feeding wiring 120 having a relatively long linear distance in the column direction may be substantially the same. Accordingly, the reduction of the above-described phase difference and signal loss may be implemented through the structure arrangement.

In some embodiments, the first connector 210 may include a first terminal 214 disposed at the row directional side to be electrically connected to the terminal end of the above-described feed wiring 120 (e.g., the terminal end of the second portion 120b).

Figure 2:
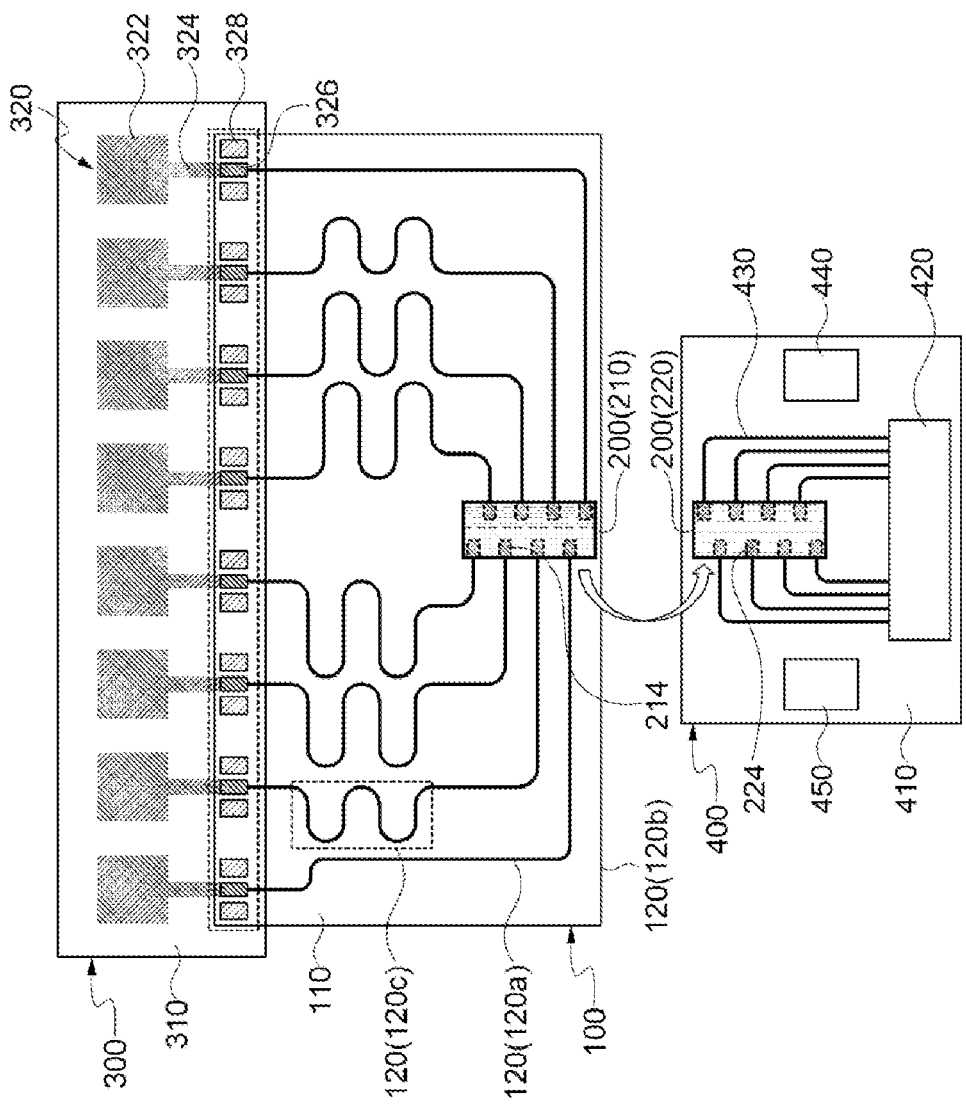
FIG. 2 is a schematic top plan view illustrating an antenna package in accordance with exemplary embodiments.

Although the first terminal 214 is not visually recognized in the plan view, the first terminal 214 is illustrated in FIGS. 1 and 2 for convenience of descriptions.

For example, a plurality of the first terminals 214 may be arranged to form first terminal columns having a double-column structure.

For example, adjacent first terminal columns may be arranged such that the first terminals 214 do not face each other in the row direction. Accordingly, a sufficient separation distance between the neighboring first terminals 214 may be implemented so that signal interference and signal loss between the first terminals 214 may be reduced.

For example, a ground structure may be disposed between the first terminals 214. In this case, an additional signal interference prevention and noise shielding between the first terminals 214 may be implemented.

In some embodiments, a length of the first connector 210 in the column direction may be greater than a length of the first connector 210 in the row direction. Accordingly, the number of the first terminals 214 capable of being disposed at the row directional side of the first connector 210 may be increased. Thus, a relatively large number of the feed wirings 120 may be connected to one connector 200 to improve spatial efficiency.

In some embodiments, as illustrated in FIG. 1, a plurality of feeding wirings 120 may be asymmetrically arranged based on a central line CL extending in the column direction on the first connector 210 in the plan view. In this case, the lengths of the feeding wirings 120, each of which is connected to the first terminals 214 disposed in a zigzag configuration or a staggered configuration in the row direction may be adjusted to be substantially the same. Accordingly, the phase difference and the signal loss between the antenna units may be reduced or prevented.

The term "central line CL" used herein may refer to mean a virtual line that bisects a row direction length of the first core layer 110 and/or the first connector 210.

In some embodiments, the package board 100 may further include a coverlay film formed on the first core layer 110 to cover the above-described feeding wirings 120.

FIG. 2 is a schematic top plan view illustrating an antenna package in accordance with exemplary embodiments.

Referring to FIG. 2, the antenna package may include an antenna device 300, the package board 100 and a circuit board 400, and the package board 100 and the circuit board 400 may be electrically connected through the connector 200.

The antenna device 300 may include an antenna dielectric layer 310 and an antenna unit 320 disposed on the antenna dielectric layer 310.

The antenna dielectric layer 310 may include a transparent resin film that may include a polyester-based resin such as polyethylene terephthalate, polyethylene isophthalate, polyethylene naphthalate and polybutylene terephthalate; a cellulose-based resin such as diacetyl cellulose and triacetyl cellulose; a polycarbonate-based resin; an acrylic resin such as polymethyl (meth)acrylate and polyethyl (meth)acrylate; a styrene-based resin such as polystyrene and an acrylonitrile-styrene copolymer; a polyolefin-based resin such as polyethylene, polypropylene, a cycloolefin or polyolefin having a norbornene structure and an ethylene-propylene copolymer; a vinyl chloride-based resin; an amide-based resin such as nylon and an aromatic polyamide; an imide-based resin; a polyethersulfone-based resin; a sulfone-based resin; a polyether ether ketone-based resin; a polyphenylene sulfide resin; a vinyl alcohol-based resin; a vinylidene chloride-based resin; a vinyl butyral-based resin; an allylate-based resin; a polyoxymethylene-based resin; an epoxy-based resin; a urethane or acrylic urethane-based resin; a silicone-based resin, etc. These may be used alone or in a combination of two or more therefrom.

In some embodiments, an adhesive film such as an optically clear adhesive (OCA) or an optically clear resin (OCR) may be included in the antenna dielectric layer 310. In some embodiments, the antenna dielectric layer 310 may include an inorganic insulating material such as silicon oxide, silicon nitride, silicon oxynitride, glass, or the like.

In some embodiments, a dielectric constant of the antenna dielectric layer 310 may be adjusted in a range from about 1.5 to about 12. When the dielectric constant exceeds about 12, a driving frequency may be excessively decreased, so that driving in a desired high or ultra-high frequency band may not be implemented.

The antenna unit 320 may be formed on a top surface of the antenna dielectric layer 110. For example, a plurality of the antenna units 320 may be arranged in an array form along a width direction of the antenna dielectric layer 310 or the antenna package to form an antenna pattern row.

The antenna unit 320 may include a radiator 322 and a transmission line 324. The radiator 322 may have, e.g., a polygonal plate shape, and the transmission line 324 may extend from a side of the radiator 322. The transmission line 324 may be formed as a single member substantially integral with the radiator 322, and may have a width smaller than that of the radiator 322.

The antenna unit 320 may further include a signal pad 326. The signal pad 326 may be connected to one end portion of the transmission line 324. In an embodiment, the signal pad 326 may be formed as a member substantially integral with the transmission line 324, and a terminal end portion of the transmission line 124 may serve as the signal pad 126.

In some embodiments, a ground pad 328 may be disposed around the signal pad 326. For example, a pair of the ground pads 328 may be disposed to face each other with the signal pad 326 interposed therebetween. The ground pad 128 may be electrically and physically separated from the transmission line 324 and the signal pad 326.

In some embodiments, the antenna dielectric layer 310 may serve as the first core layer 110 of the package substrate 100. In this case, the first core layer 110 may be provided as a member substantially integral with the antenna dielectric layer 310. Additionally, the feeding wiring 120 may be directly connected to the transmission line 324, and the signal pad 326 may be omitted.

In exemplary embodiments, the antenna unit 320 or the radiator 322 may be designed to have a resonance frequency corresponding to a high frequency or ultra-high frequency band such as 3G, 4G, 5G or higher band. In a non-limiting example, the resonance frequency of the antenna unit 320 may be about 10 GHz or more, or from about 20 GHz to 45 GHz.

In some embodiments, the radiators 322 having different sizes may be arranged on the antenna dielectric layer 310. In this case, the antenna device 300 may serve as a multi-radiation or multi-band antenna radiating in a plurality of resonance frequency bands.

The antenna unit 320 may include silver (Ag), gold (Au), copper (Cu), aluminum (Al), platinum (Pt), palladium (Pd), chromium (Cr), titanium (Ti), tungsten (W), niobium (Nb), tantalum (Ta), vanadium (V), iron (Fe), manganese (Mn), cobalt (Co), nickel (Ni), zinc (Zn), tin (Sn), molybdenum (Mo), calcium (Ca) or an alloy containing at least one of the metals. These may be used alone or in combination thereof.

In an embodiment, the antenna unit 320 may include silver (Ag) or a silver alloy (e.g., silver-palladium-copper (APC)), or copper (Cu) or a copper alloy (e.g., a copper-calcium (CuCa)) to implement a low resistance and a fine line width pattern.

In some embodiments, the antenna unit 320 may include a transparent conductive oxide such as indium tin oxide (ITO), indium zinc oxide (IZO), zinc oxide (ZnOx), indium zinc tin oxide (IZTO), etc.

In some embodiments, the antenna unit 320 may include a stacked structure of a transparent conductive oxide layer and a metal layer. For example, the antenna unit 320 may include a double-layered structure of a transparent conductive oxide layer-metal layer, or a triple-layered structure of a transparent conductive oxide layer-metal layer-transparent conductive oxide layer. In this case, flexible property may be improved by the metal layer, and a signal transmission speed may also be improved by a low resistance of the metal layer. Corrosive resistance and transparency may be improved by the transparent conductive oxide layer.

The antenna unit 320 may include a blackened portion, so that a reflectance at a surface of the antenna unit 320 may be decreased to suppress a visual recognition of the antenna unit 320 due to a light reflectance.

In an embodiment, a surface of the metal layer included in the antenna unit 320 may be converted into a metal oxide or a metal sulfide to form a blackened layer. In an embodiment, a blackened layer such as a black material coating layer or a plating layer may be formed on the antenna unit 320 or the metal layer. The black material or plating layer may include silicon, carbon, copper, molybdenum, tin, chromium, molybdenum, nickel, cobalt, or an oxide, sulfide or alloy containing at least one therefrom.

A composition and a thickness of the blackened layer may be adjusted in consideration of a reflectance reduction effect and an antenna radiation property.

In some embodiments, the radiator 322 and the transmission line 324 may have a mesh-pattern structure to improve a transmittance. In this case, a dummy mesh pattern (not illustrated) may be formed around the radiator 322 and the transmission line 324.

The signal pad 326 and the ground pad 328 may be a solid pattern formed of the above-described metal or alloy in consideration of a feeding resistance reduction, a noise absorption efficiency, etc.

In an embodiment, the radiator 322 may have the mesh-pattern structure, and at least a portion of the transmission line 324 may include a solid structure.

The radiator 322 may be disposed in a display area of the image display device, and the signal pad 326 and the ground pad 328 may be disposed in a non-display area or a bezel area of the image display device. At least a portion of the transmission line 324 may also be disposed in the non-display area or the bezel area.

In exemplary embodiments, the package board 100 may be electrically connected to the antenna unit 320 on the first core layer 110.

In an embodiment, the feeding wirings 120 may be connected to or bonded to the signal pads 326 of the antenna units 320. For example, a portion of the coverlay film of the package board 100 may be removed to expose one end portions of the feeding wirings 120. The exposed one end portions of the feeding wirings 120 may be bonded to the signal pads 326.

For example, a conductive bonding structure such as an anisotropic conductive film (ACF) may be attached on the signal pads 326, and then a bonding region BR of the package board 100 in which the one end portions of the feeding wirings 120 are located may be disposed on the conductive bonding structure. Thereafter, the bonding region BR of the package board 100 may be attached to the antenna device 300 by a heat treatment/pressurization process, and the feeding wiring 120 may be electrically connected to each signal pad 326.

As illustrated in FIG. 2, the feeding wirings 120 may be independently connected or bonded to each of the signal pads 326 of the antenna units 320. In this case, power and control signals may be independently supplied from the antenna driving integrated circuit (IC) chip 420 to each antenna unit 320.

In exemplary embodiments, the package board 100 and the circuit board 400 may be electrically connected to each other through the connector 200.

In some embodiments, the connector 200 may serve as a Board to Board (B2B) connector, and may include a first connector 210 and a second connector 220.

As described above, the first connector 210 may be mounted on the package board 100 using a surface mount technology (SMT) to be electrically connected to the terminal ends of the feeding wirings 120.

The circuit board 400 may be, e.g., a main board of the image display device, and may be a rigid printed circuit board. For example, the circuit board 400 may include a resin (e.g., epoxy resin) layer impregnated with an inorganic material such as glass fiber (e.g., a prepreg) as a second core layer 410. The circuit board 400 may include circuit wirings distributed on a surface of the second core layer 410 and at an inside of the second core layer 410.

An antenna driving IC chip 420 may be mounted on the circuit board 400. As described above, the second connector 220 may be mounted on the circuit board 400 using, e.g., a surface mount technology (SMT). For example, the second connector 220 may be electrically connected to the antenna driving IC chip 420 through a connection wiring 430 included in the circuit board 400.

In some embodiments, the second connector 220 may include a second terminal 224 disposed at the row directional side of the second connector and electrically connected to the first terminal 214.

For example, a plurality of the second terminals 224 may be arranged to form second terminal columns having a double-column structure.

In some embodiments, the second terminal columns may be disposed at positions corresponding to the first terminal columns to be coupled to the first terminal columns. For example, adjacent second terminal columns may be arranged such that the second terminals 224 do not face each other in the row direction.

As described above, in some embodiments, a length of the first connector 210 in the column direction may be greater than a length of the first connector 210 in the row direction. In this case, a length of the second connector 220 in the column direction also may be greater than a length of the second connector 220 in the row direction. Thus, the connector 200 coupling structure may be formed stably.

As indicated by an arrow in FIG. 2, the first connector 210 mounted on the package board 100 and the second connector 220 mounted on the circuit board 400 may be coupled to each other. For example, the first connector 210 may serve as a plug connector or male connector, and the second connector 220 may serve as a receptacle connector or female connector.

Thus, a connection of the package board 100 and the circuit board 400 may be implemented, and the antenna driving IC chip 420 and the antenna units 320 may be electrically connected.

Thus, a power supply/control signal (e.g., a phase signal, a beam tilting signal, etc.) from the antenna driving IC chip 420 may be applied to the antenna unit 320. Additionally, an intermediate structure of the package board 100-the connector 200-the circuit board 400 may be formed.

Thus, the package board 100 and the circuit board 400 may be easily coupled to each other by using the connector 200 without an additional bonding process or a heating/pressing process.

Therefore, a dielectric loss due to thermal damages to the board and an increase of resistance due to wiring damages caused by the heating/pressing process may be prevented to suppress the signal loss in the antenna unit 320.

Further, the package board 100 on which the first connector 210 is mounted may be bent such that the first connector 210 to the second connector 220 may be coupled to each other. Thus, a connection with the circuit board 400 disposed at a rear portion of the image display device may be easily implemented.

In some embodiments, a circuit device 440 and a control device 450 may be mounted on the circuit board 400 in addition to the antenna driving IC chip 420. The circuit device 440 may include, e.g., a capacitor such as a multi-layered ceramic capacitor (MLCC), an inductor, a resistor, or the like. The control device 450 may include, e.g., a touch sensor driving IC chip, an application processor (AP) chip, or the like.

Figure 3:
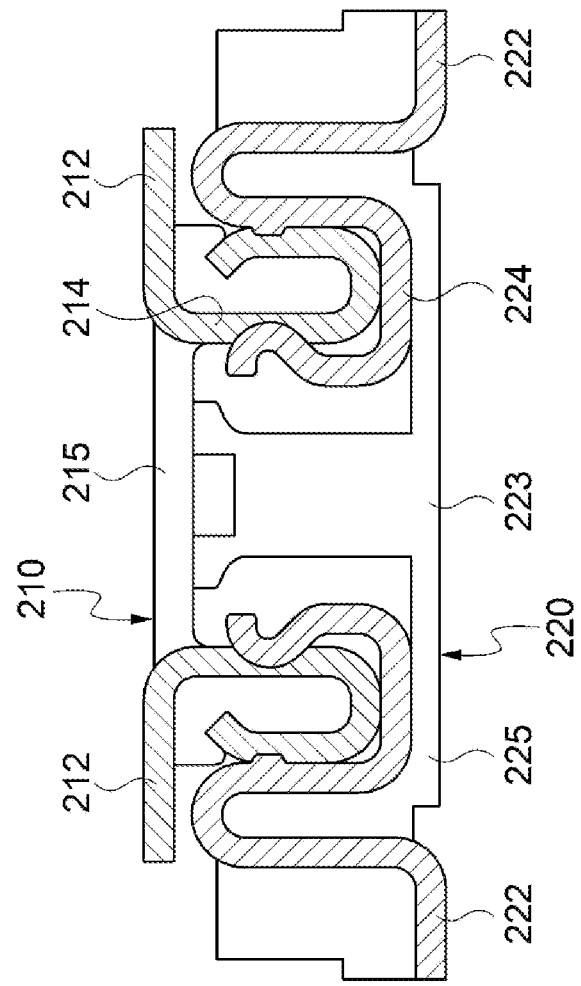
FIG. 3 is a schematic top plan view illustrating a connector in accordance with exemplary embodiments.

FIG. 3 is a schematic top plan view illustrating a connector in accordance with exemplary embodiments. Specifically, FIG. 3 is a schematic cross-sectional view of the connector 200 in a combination of the first connector 210 and the second connector taken along line I-I' of FIG. 1.

Referring to FIG. 3, each of the first connector 210 and the second connector 220 may include terminals having a double-column structure.

The first connector 210 may include a first insulator 215, and first terminals 214 may be arranged on the first insulator 215 in the double-column structure. First connection leads 212 may extend to both sides of the first connector 210 in the row direction to form first lead columns having the double-column structure.

The second connector 220 may include a second insulator 225, and second terminals 224 may be arranged on the second insulator 225 in a double-column structure. The second connection leads 222 may extend to both sides of the second connector 220 in the row direction to form second lead columns having the double-column structure. For example, the second insulator 225 may include an insulating barrier 223 that may separate two terminal columns.

In some embodiments, the first terminals 214 included in the first connector 210 may serve as plug pins, and the second terminals 224 included in the second connector 220 may serve as landing pins. Accordingly, each of the first terminals 214 may be physically and electrically coupled to each of the second terminals 224.

In an embodiment, the first and second insulators 215 and 225 may include an insulating material that may have a permittivity (Dk, or dielectric constant) in a range from 2 to 3.5, and a loss tangent (Df, or a dielectric loss) in a range from 0.0015 to 0.007.

Within the above range, for example, in a communication band of a high-frequency or ultra-high frequency range of 20 GHz or more, signal loss and gain reduction in the connector 200 may be prevented and sufficient radiation properties may be obtained from the antenna units 320.

In some embodiments, the first and second insulators 215 and 225 may include a liquid crystal polymer (LCP) structure, a polyphenylene sulfide (PPS) structure, and/or a modified polyimide (MPI) structure.

Figure 4:
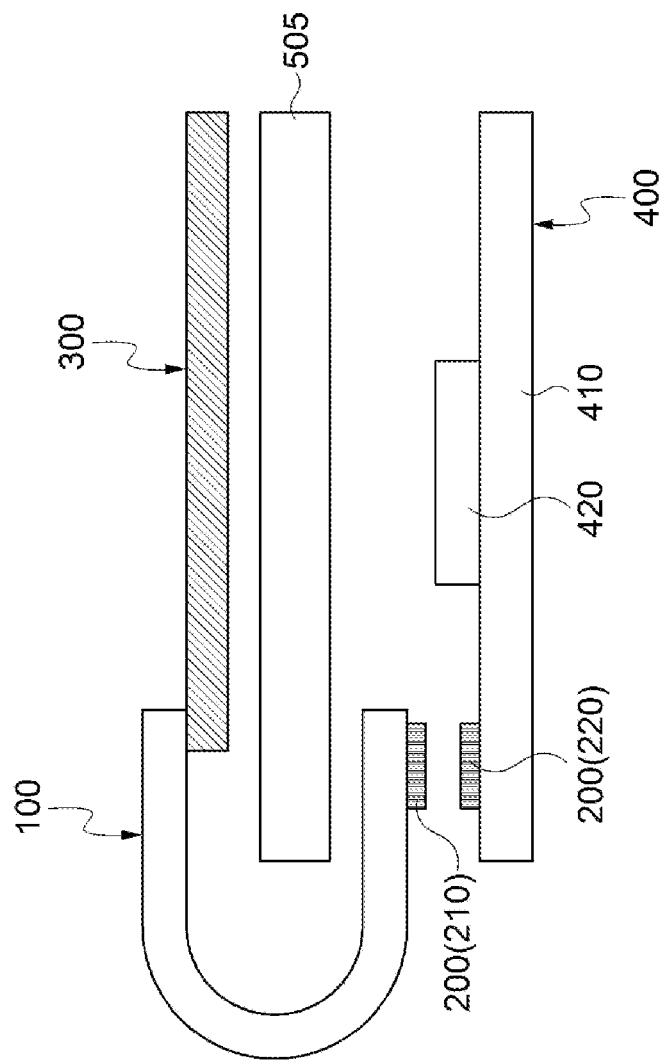
FIGS. 4 and 5 are a schematic cross-sectional view and a schematic top plan view, respectively, illustrating an image display device in accordance with exemplary embodiments.
Figure 5:
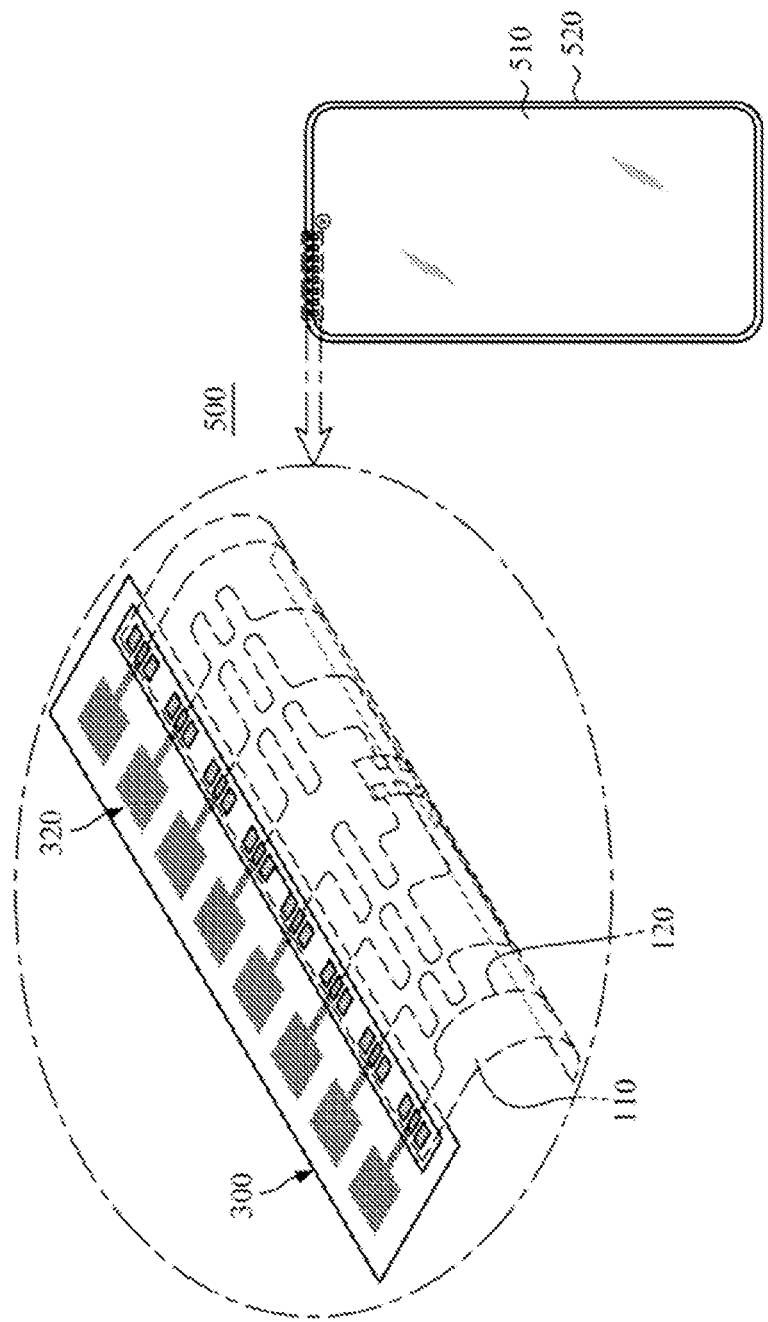

FIGS. 4 and 5 are a schematic cross-sectional view and a schematic top plan view, respectively, illustrating an image display device in accordance with exemplary embodiments.

Referring to FIGS. 4 and 5, an image display device 500 may be fabricated in the form of, e.g., a smartphone, and FIG. 5 illustrates a front portion or a window surface of the image display device 500. The front portion of the image display device 500 may include a display area 510 and a peripheral area 520. The peripheral area 520 may correspond to, e.g., a light-shielding portion or a bezel portion of the image display device.

For example, the antenna device 300 included in the above-described antenna package may be disposed toward the front portion of the image display device 500, and may be disposed on the display panel 505. In an embodiment, the radiators 322 may be at least partially disposed on the display area 510.

In this case, the radiator 322 may include a mesh-pattern structure, and a decrease of transmittance due to the radiator 322 may be prevented. The pads 326 and 328 included in the antenna unit 320 may be formed in a solid metal pattern, and may be disposed in the peripheral area 520 to prevent degradation of an image quality.

In some embodiments, the package board 100 may be bent and disposed at a rear portion of the image display device 500, and may extend toward the circuit board 400 (e.g., the main board) on which the antenna driving IC chip 420 is mounted.

The package board 100 and the circuit board 400 may be interconnected through the connector 200, so that feeding and antenna driving control to the antenna device 300 may be performed through the antenna driving IC chip 420.

As described above, the feeding wirings 120 may be electrically connected to the first connector 210 through the row directional side of the first connector 210, so that the phase difference between the antenna units 320 and the signal loss of the antenna device 300 may be prevented.

What is claimed is:

1. A package board, comprising:
a first core layer;
a feeding wiring disposed on the first core layer, the feeding wiring comprising:
a first portion extending in a column direction of the first core layer; and
a second portion bent from the first portion to extend in a row direction of the first core layer; and
a first connector mounted on the first core layer and electrically connected to the feeding wiring through a row directional side thereof,
wherein the feeding wiring comprises a plurality of feeding wirings, and at least two feeding wirings of the plurality of feeding wirings each includes a winding portion; and
an extension length of each winding portion included in different feeding wirings decreases as a distance from the first connector increases in the row direction.

2. The package board of claim 1, wherein the first connector comprises a first terminal disposed at the row directional side and electrically connected to an end portion of the feeding wiring; and
a plurality of the first terminals are arranged to form first terminal columns, and the first terminal columns are arranged in the row direction to form a double-column structure.

3. The package board of claim 2, wherein two first terminals of the plurality of the first terminals which are included in different first terminal columns are staggered in the row direction.

4. The package board of claim 2, wherein each of the plurality of feeding wirings electrically connected to each of the first terminals of the first connector through the row directional side of the first connector.

5. A package board, comprising:
a first core layer;
a feeding wiring disposed on the first core layer, the feeding wiring comprising:
a first portion extending in a column direction of the first core layer; and
a second portion bent from the first portion to extend in a row direction of the first core layer; and
a first connector mounted on the first core layer and electrically connected to the feeding wiring through a row directional side thereof,
wherein the feeding wiring comprises a plurality of feeding wirings, and the plurality of feeding wirings are asymmetrically arranged with respect to a central line extending in the column direction on the first connector in a plan view.

6. The package board of claim 4, wherein lengths of the plurality of feeding wirings are the same.

7. The package board of claim 4, wherein the plurality of feeding wirings are asymmetrically arranged with respect to a central line extending in the column direction on the first connector in a plan view.

8. The package board of claim 1, wherein a length of the first connector in the column direction is greater than a length of the first connector in the row direction.

9. The package board of claim 1, wherein the first connector has an upper side, a lower side and both lateral sides in a plan view; and
the feeding wiring is connected only through at least one of the both lateral sides of the first connector.

10. An antenna package, comprising:
an antenna device comprising an antenna unit; and
the package board of claim 1 electrically connected to the antenna unit through the feeding wiring.

11. The antenna package of claim 10, wherein the antenna unit comprises a radiator, a transmission line connected to the radiator, and a signal pad connected to an end portion of the transmission line; and
the signal pad is electrically connected to the feeding wiring.

12. The antenna package of claim 10, further comprising:
a circuit board comprising a second core layer and a connection wiring;
a second connector mounted on the second core layer and coupled to the first connector including a first terminal, the second connector comprising a second terminal electrically connected to the first terminal; and
an antenna driving integrated circuit chip mounted on the second core layer and electrically connected to the second connector through the connection wiring.

13. The antenna package of claim 12, wherein the second terminal comprises a plurality of second terminals forming second terminal columns of a double-column structure arranged in the row direction.

14. An image display device, comprising:
a display panel; and
the antenna package of claim 10 disposed on the display panel.

* * * * *